Nov. 5, 1968 W. E. BRENEMAN 3,409,475

THERMOELECTRIC HEAT PUMP HAVING PRINTED CIRCUIT INTERCONNECTIONS

Filed Sept. 19, 1962

INVENTOR.
WALTER E. BRENEMAN

BY

ATTORNEY 3,409,475

THERMOELECTRIC HEAT PUMP HAVING PRINTED CIRCUIT INTERCONNECTIONS

Walter E. Breneman, York, Pa., assignor to Borg-Warner Corporation, Chicago, Ill., a corporation of Illinois Filed Sept. 19, 1962, Ser. No. 225,415
1 Claim. (Cl. 136—203)

This invention relates to thermoelectric circuits and, more particularly, to a method of expeditiously constructing such a circuit.

The value of a thermoelectric circuit for heating and cooling has been clearly demonstrated. In such a thermoelectric circuit, extensive wiring is required between various thermoelectric billets because many such billets must be placed in series in order to bring down the current flow to an amount low enough for handling. Even with many billets in series, however, there is still a rather high current flow requiring fairly large electrical connectors between billets. This has resulted in a greatly increased cost and has also limited the length of the billets to an amount no less than the required diameter of the electrical connecter between the billets.

There have been strides made to correct this situation. In one such application, a pair of base aluminum members are anodized and a copper circuit printed on each member. Billets of thermoelectric materials are then directly soldered between the base members. This obviates the necessity for the normal electrical wiring connections between the billets. The construction, as set out above, suffers from several disadvantages, which will be brought out hereinafter in a comparison with applicant's preferred method of constructing a thermoelectric circuit utilizing printed circuitry techniques.

In carrying out applicant's invention, a plurality of thermoelectric modules are utilized. Each module consists of a plurality of thermoelectric billets connected between heavy copper connectors with a suitable electrical insulating material between the billets and connectors. Such a module has become a standard element in the thermoelectric field. Normally, various modules are electrically wired together in order to provide a complete circuit. In applicant's method of constructing a thermoelectric circuit, a sheet of a suitable electrical insulating and heat conducting material, such as an epoxy resin loaded with beryllium oxide or Mylar, is coated on one surface thereof with copper. The other surface has an electrical circuit printed thereon. Each such sheet is provided with a plurality of modules soldered thereon. It is only a portion of the printed circuitry which is utilized for conducting electricity; i.e., that portion which connects one module with the next. The greater part of the printed circuitry is only utilized to conduct heat from the module copper connectors through the sheet to any suitable source. One of said sheets, with the suitable number of modules soldered thereon, has a top and bottom member attached thereto, over which streams of a heat-exchange medium may flow either adding heat to or removing heat from the modules.

The advantages of this construction are many. Since the greater part of the printed circuitry does not conduct current, it need not be of too great a thickness, since there is a limit to the thickness possible in printed circuitry techniques. In applicant's construction, those parts of the circuit which actually conduct current are made of greater face area in order to successfully conduct such current. However, even where this is not done, there is only localized heating at these specific points rather than heating over the entire circuit. Further, in applicant's construction, in the event of failure of the circuit, an entire module can be removed therefrom as a unit and replaced with another such unit with a minimum of effort expended. Another advantage is that which relates to quality control, in that each module can be easily tested for electrical continuity prior to its utilization in a circuit, and a sufficient number tested according to laws of mechanical probability to give a desired certainty of capacity.

It is an object of the invention, therefore, to provide a thermoelectric circuit comprising a heat conducting electrical insulating sheet member having a printed copper circuit on the one side thereof, and a plurality of thermoelectric modules attached to said sheet member and thereby to said printed circuit, whereby the greater portion of the electrical current flow is transmitted internally by said modules with a portion only being transmitted through said printed circuit; the remainder of said printed circuit being utilized for heat transfer purposes.

A further object is to provide a thermoelectric circuit of the type just above mentioned, including means forming a continuous copper coating on the other side of said sheet member. A still futher object of the invention is to provide a circuit, as set out just above, wherein said heat conducting electrical insulating sheet member is a beryllium oxide loaded epoxy resin.

The invention consists of the novel constructions, arrangements and devices to be hereinafter described and claimed for carrying out the above-stated objects and such other objects as will appear from the following description of a preferred embodiment of the invention described with reference to the accompanying drawings, in which:

Like numbers refer to like parts throughout the several views.

Figures 1, 2, 3, 4:
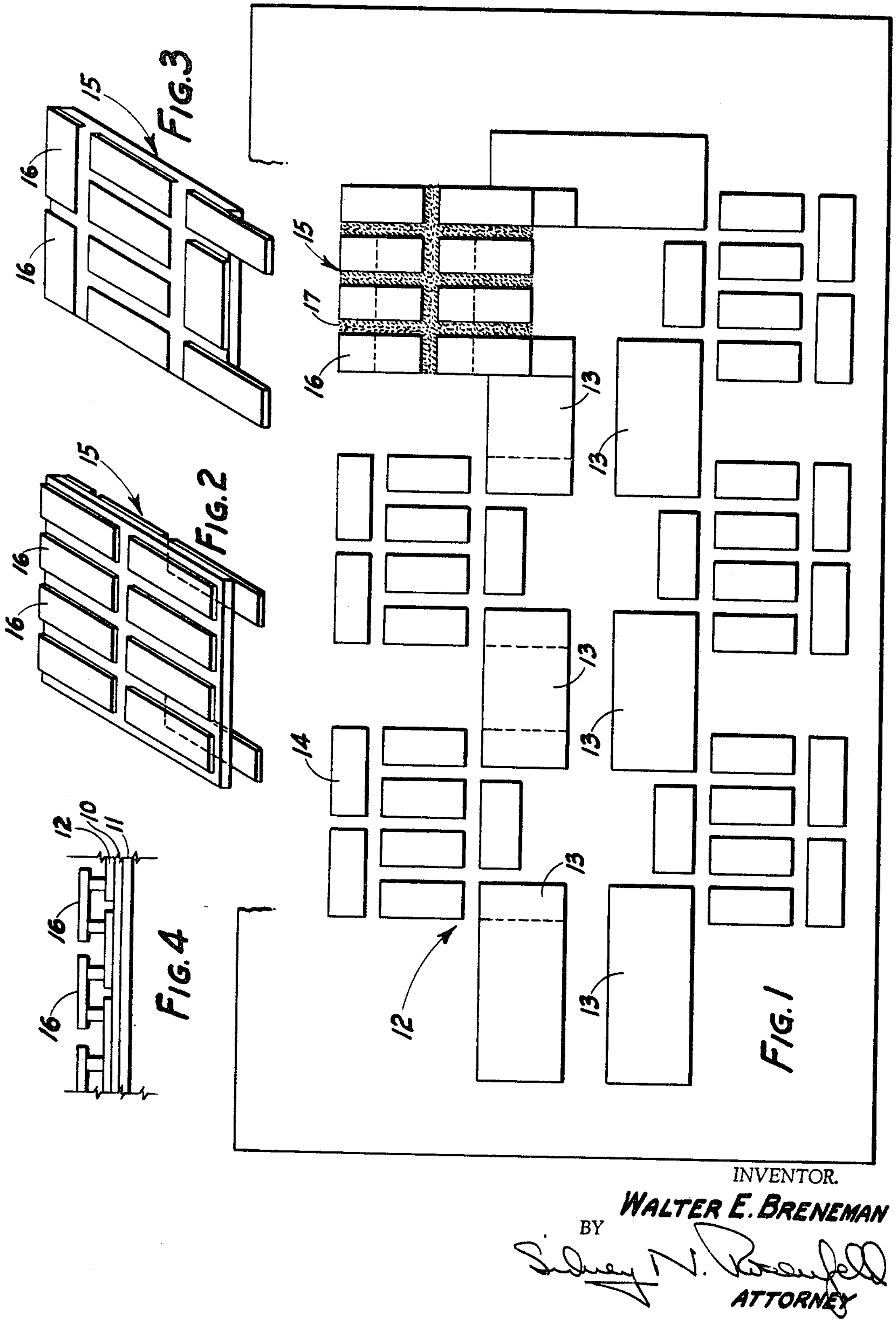
FIG. 1 is a plan view of a thermoelectric sheet having a printed circuit thereon according to the invention and showing a typical thermoelectric module mounted thereon.
FIG. 2 is a view in perspective of a thermoelectric module.
FIG. 3 is a view in perspective of a thermoelectric module with the bottom side uppermost.
FIG. 4 is a partial end view of a completed thermoelectric circuit.

In carrying out the invention as seen in the drawings, sheet 10 is provided which sheet is composed of a thermally conducting and electrically non-conducting material such as mylar or an epoxy resin loaded with beryllium oxide. Sheet 10 has a continuous copper covering 11 attached to one side thereof, and a printed copper circuit 12 attached to the other side thereof. Printed circuit 12 can take any desired pattern or arrangement, and comprises a plurality of electrical conductors 13 and heat conductors 14. It will be apparent as the description progresses that electrical conducting members 13 are also heat conductors, while heat conductors 14 may conduct current. However, their primary purpose is as set out aforesaid. A sheet 10, with its continuous copper coating 11 on one side thereof and printed circuitry 12 on the other side thereof, is herein referred to as a thermoelectric sheet assembly.

A plurality of thermoelectric modules 15 are provided consisting of a plurality of "*p*" and "*n*" thermoelectric billets soldered between copper connectors 16 with the copper connectors 16 being so arranged that there is secured a series flow of current through the "*p*" and "*n*" billets (see FIGS. 2 and 3). An insulating filler material 17 is provided between copper connectors 16 and around the "*p*" and "*n*" billets to complete the module assembly.

It will be apparent from an inspection of the drawings that the printed circuitry 12 is laid on sheet 10 in such a manner as to correspond with the bottom copper connectors 16 of modules 15 with which the printed circuitry is in contact. From a further inspection of the drawings, it can be seen that electrical conductors 13 of the printed circuit 12 are of considerably greater width in the direction of electrical type of flow than are heat conductors 14 or copper connectors 16. This is possible in the herein disclosed circuit, and provides the necessary area for the current flow in those instances where the thickness of the printed circuitry may not be made sufficiently great to carry the desired current flow. However, even where electrical conductors 13 are not so enlarged, it will be appreciated that areas of localized heating will only occur in isolated spots rather than over the entire circuit.

Continuous copper coating 11 found on the bottom side of the sheet assembly, permits the attachment of any suitable bottom member for dissipating heat or for removing heat from any desired substance.

It is believed that the advantages of the herein disclosed circuit are obvious over the prior art, wherein electrical billets are directly soldered to printed circuit conductors, as set out hereinbefore.

What is claimed is:

1. In a thermoelectric heat pump of the type including a base, said base including a sheet formed of material having relatively high thermol conductivity and relatively low electrical conductivity, a copper coating over substantially the entire surface of one side of said sheet, a printed copper circuit on the opposite side of said sheet, said printed copper circuit including spaced arrays of heat conductor patterns, each said pattern including a plurality of spaced copper coatings, each of said copper coatings having a predetermined area, and a plurality of electrically conductive coatings, each of said spaced electrically conductive coatings having a predetermined area and being located so as to connect at least three arrays in series; and a plurality of thermoelectric modules secured to said base, each module including a plurality of P and N thermoelectric elements alternately connected in series by a plurality of copper connectors arranged in a predetermined pattern, said modules being secured to said base such that said copper connectors are registered and secured in electrical contact with said spaced copper coatings in each of said arrays, the improvement wherein said area of each of said electrically conductive coatings is substantially greater than said area of any one of said spaced copper coatings.

References Cited

UNITED STATES PATENTS

| | | | |
|---|---|---|---|
| 2,229,481 | 1/1941 | Telkes | 136—236 X |
| 2,932,953 | 4/1960 | Becket et al. | 136—204 X |
| 3,075,360 | 1/1963 | Elfving et al. | 136—204 |
| 3,158,927 | 12/1964 | Saunders. | |
| 3,231,965 | 2/1966 | Roes | 136—201 |

ALLEN B. CURTIS, *Primary Examiner.*